(12) United States Patent
Kohl et al.

(10) Patent No.: US 8,765,512 B2
(45) Date of Patent: Jul. 1, 2014

(54) PACKAGING COMPATIBLE WAFER LEVEL CAPPING OF MEMS DEVICES

(71) Applicant: Georgia Tech Research Corporation, Atlanta, GA (US)

(72) Inventors: Paul A Kohl, Atlanta, GA (US); Rajarshi Saha, Atlanta, GA (US); Nathan Fritz, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/706,488

(22) Filed: Dec. 6, 2012

(65) Prior Publication Data
US 2013/0341736 A1 Dec. 26, 2013

Related U.S. Application Data

(60) Provisional application No. 61/567,877, filed on Dec. 7, 2011.

(51) Int. Cl.
*H01L 29/84* (2006.01)
*B81B 3/00* (2006.01)
*B81C 1/00* (2006.01)

(52) U.S. Cl.
CPC ........... *B81C 1/00261* (2013.01); *B81B 3/0018* (2013.01); *B81C 2201/0108* (2013.01); *B81C 2203/0154* (2013.01); *B81C 1/00333* (2013.01)
USPC ........... 438/51; 438/52; 438/50; 257/E29.324

(58) Field of Classification Search
USPC ....... 257/415–420, 254, E29.324; 438/50–53
See application file for complete search history.

(56) References Cited

U.S. PATENT DOCUMENTS 7,052,821 B2 5/2006 Kohl et al.

2007/0273013 A1* 11/2007 Kohl et al. ..................... 257/682

FOREIGN PATENT DOCUMENTS

WO WO 2005/089348 A3 9/2005

OTHER PUBLICATIONS

Fritz, et.al., "Lead Frame Packaging of MEMS . . . ", NSTI-Nanotech, 2, pp. 314-317, (2011).
Masayoshi Esashi, "Wafer level packaging of MEMS", J. Micromech. Microeng. vol. 18, pp. 1-13, (2008).
Saha, et.al., "Three dimensional air-gap structures for MEMS Packaging", Proceed. of the 2010 Elec. Comp. & Tech. Conf., NV, pp. 811-815, (2010).

(Continued)

*Primary Examiner* — Matthew W Such
*Assistant Examiner* — Scott Stowe
(74) *Attorney, Agent, or Firm* — Balaram Gupta

(57) ABSTRACT

This invention discloses and claims a cost-effective, wafer-level package process for microelectromechanical devices (MEMS). Specifically, the movable part of MEMS device is encapsulated and protected while in wafer form so that commodity, lead-frame packaging can be used. An overcoat polymer, such as, epoxycyclohexyl polyhedral oligomeric silsesquioxanes (EPOSS) has been used as a mask material to pattern the sacrificial polymer as well as overcoat the air-cavity. The resulting air-cavities are clean, debris-free, and robust. The cavities have substantial strength to withstand molding pressures during lead-frame packaging of the MEMS devices. A wide range of cavities from 20 μm×400 μm to 300 μm×400 μm have been fabricated and shown to be mechanically stable. These could potentially house MEMS devices over a wide range of sizes. The strength of the cavities has been investigated using nano-indentation and modeled using analytical and finite element techniques. Capacitive resonators packaged using this protocol have shown clean sensing electrodes and good functionality.

20 Claims, 13 Drawing Sheets

(56) References Cited

OTHER PUBLICATIONS

Gan, et.al., "Getter free vacuum packaging for MEMS", Sensors and Actuators A: Physical, vol. 149, pp. 159-164, (2009).

Joseph, et.al., "Wafer-Level Packaging of Micromechanical Resonators", IEEE Transactions on Advanced Packaging, vol. 30(1), pp. 19-26, (2007).

Monajemi, et.al., "Characterization of a Polymer-Based . . . ", 11th Annual Int'l Symp. on Adv. Pack. Mat: Prop. & Inter. pp. 139-144, (2006).

Monajemi, et.al., "A low-cost wafer level MEMS packaging technology", IEEE International Conference on MEMS, pp. 634-637, (2005).

Rais-Zadeh, et.al., "A Packaged Micromachined Switched Turnable Inductor", Proceedings of MEMS, Japan, pp. 799-802, (2007).

Reed, et.al., "Compliant Wafer Level Package (CWLP) wtih embedded air-gaps for sea of . . . ", Proceedings of the IEEE Int'l Interconnect Technology Conf., pp. 151-153, (2001).

Fritz, et.al., "Photodefinable Epoxycyclohexyl Polyhedral Oligomeric Silsesquioxane", Journal of Electronic Materials, vol. 39(2), pp. 149-156, (2010).

Chen, et.al., "Copolymerization of Carbon Dioxide and Epoxides . . . ", Journal of Applied Polymer Science, vol. 107, pp. 3871-3877, (2008).

Du, et.al., "Synthesis and Degradation Behavior of Poly(Propylene Carbonate) . . . ", Journal of Applied Polymer Science, vol. 92, pp. 1840-1846, (2004).

Spencer, et.al., "Stabilization of the thermal decomposition of Poly(Propylene Carbonate) . . . ", Journal of Electronic Materials, vol. 40(3), pp. 1350-1363, (2011).

Fritz, et.al., "Polycarbonates as temporary adhesives", International Journal of Adhesion & Adhesives, vol. 38, pp. 45-49, (2012).

Wu, et.al., "Fabrication of Microchannels using Polynorbornene Photosensitive . . . ", Journal of the Electrochemical Society, vol. 150(9), pp. H205-H213, (2003).

Vlassak, et.al., "A new bulge test technique for the determination of Young's . . . ", Journal of Materials Research, vol. 7(12), pp. 3242-3249, (1992).

Huang, et.al., "Stress, Sheet Resistance, and Microstructure . . . ", IEEE Transactions on Device and Materials Reliability, vol. 10(1), pp. 47-54, (2010).

Spencer, et.al., "Decomposition of poly(propylene carbonate) with UV sensitive . . . ", Polymer Degradation and Stability, vol. 96, pp. 686-702 (2011).

Pourkamali, et.al., "Low-Impediance VHF and UHF Capacitive Silicon . . . Part I", IEEE Trans. on Electron Devices, vol. 54(8), pp. 2017-2023, (2007).

Pourkamali, et.al., "Low-Impediance VHF and UHF Capacitive Silicon . . . Part II", IEEE Trans. on Electron Devices, vol. 54(8), pp. 2024-2030, (2007).

Jayachandran, et.al., "Air-Channel Fabrication for Microelectromechanical . . . ", J. of Microelectromechanical Systems, vol. 12(2), pp. 147-159, (2003).

Joseph, et.al., "Improved fabrication of micro air-channels by incorporation of a structural barrier . . . ", J. Micromech. Microeng., vol. 15, pp. 35-42, (2005).

Li, et.al., "Sacrificial polymers for nanofluidic channels in biological applications", Nanotechnology, vol. 14, pp. 578-583, (2003).

Malshe, et.al., "Challenges in the Packaging of MEMS", The International Journal of Microcircuits and Electronic Packaging, vol. 22(3) pp. 233-241, (1999).

Monajemi, et.al., "Wafer-level MEMS packaging via thermally released metal-organic membranes", J. Micromech. Microeng., vol. 16, pp. 742-750, (2006).

* cited by examiner

Rectangular "Bulge" equation:

$$P = \frac{4}{3} \frac{h^3}{a^4} \frac{Et}{(1-v^2)}$$

| P(atm) | a(μm) | t(μm) | h(μm) |
|--------|-------|-------|-------|
| 40 | 10 | 0.7 | 2.8 |
| 100 | 10 | 0.7 | 2 |

5 μm

PACKAGING COMPATIBLE WAFER LEVEL CAPPING OF MEMS DEVICES

CROSS REFERENCE TO RELATED APPLICATIONS

This application claims the benefit of U.S. Provisional Application No. 61/567,877, filed Dec. 7, 2011, which is incorporated herein by reference in its entirety.

TECHNICAL FIELD

The present invention relates to a microelectromechanical system (MEMS) device package. More specifically, the present invention relates to a process of making microelectromechanical system (MEMS) device packages.

BACKGROUND

Recently, many advances have been made in the fabrication of microelectromechanical system (MEMS) structures and devices. However, proper packaging at a reduced cost still remains a pivotal challenge to achieving their overall potential (see, for example, Fritz et. al., "Lead frame packaging of MEMS devices using wafer-level, air-gap structures," NSTI-Nanotech 2011, 2, 2011, pp. 314-317). For instance, the typical packaging expense of MEMS based products can be as high as 20 to 40 percent of such a products total cost. Thus a cost efficient, integrated circuit (IC) compatible MEMS packaging process would significantly improve the overall potential of MEMS devices.

DETAILED DESCRIPTION

Figure 1:
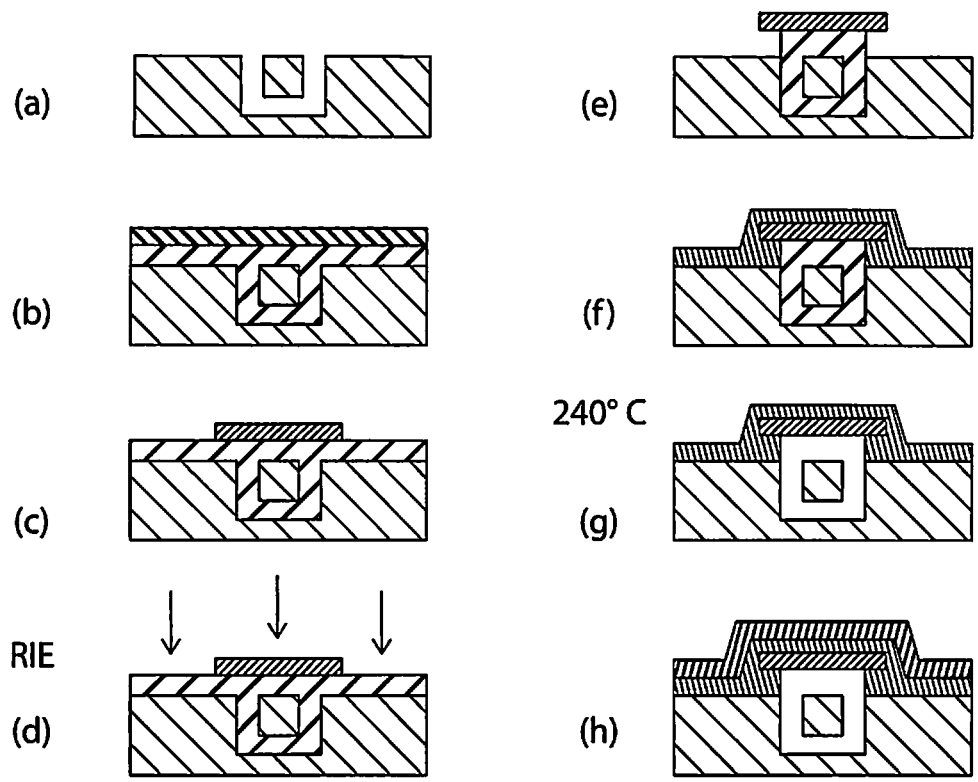
FIG. 1 shows a process flow, in accordance with embodiments of the present invention, for wafer level package.

As used herein, the term "cavity" will be understood to mean the space that is created by the decomposition of a sacrificial material. Further, it will be understood that such term is inclusive of the terms "air-cavity", "gas-cavity", "vacuum-cavity", "air-gap" and other similar terms as they are used in the known art.

As used herein, the terms "permeate" and "permeation" refer to a process where a gaseous material dissolves into a solid material, diffuses through such solid material and evaporates therefrom.

Currently there are various wafer-level packaging methods available commercially for MEMS structures and devices. Such wafer level packaging methods include, among others, interfacial bonding of a PYREX® glass lid, which has a similar coefficient of thermal expansion to silicon; bonding such lids with intermediate melting materials, such as low melting temperature glass and solder; and encapsulation using surface micromachining. Interfacial bonding can be achieved by anodic bonding of the glass lid to the MEMS wafer by applying a negative voltage to the glass at an appropriate elevated temperature or by plasma-activated bonding. For this type of bonding, electrical feed-throughs are generally made through the lid or the wafer. The use of intermediate melting materials can be applied to a non-planar surface where lateral electrical feed-throughs are employed. Where surface micromachining is employed, the cavity is generally made by etching a sacrificial layer, any openings needed for removal of the sacrificial layer are then plugged by deposition of a sealing material, thus encapsulating the MEMS structure/device. Where a vacuum cavity is required, as is generally the case for MEMS devices such as resonators and infrared sensors, the final sealing of any of the above methods is accomplished at an appropriately low pressure. Electrical feed-through structures for the electrical interconnection are indispensable for wafer level packaging. See, Esashi, "Wafer level packaging of MEMS," J. Micromech. Microeng. 18 (2008), pp. 1-13.

Air-gap structures or cavities have been used in micro and nanosurface micromachining processes for fabricating MEMS and nanoelectromechanical systems (NEMS) capable of in-plane and through-plane motion (see, for example, Saha et. al., "Three dimensional air-gap structures for MEMS packaging", Proceedings of the 2010 Electronic Components and Technology Conference, NV, 2010, pp. 811-815). These cavity structures use a low temperature, thermally decomposable sacrificial material, desirable for isolating electrical and mechanical parts. An overcoat material is generally employed on these structures, and should be tolerant of stress and temperature effects as well as being permeable to the decomposition by-products of the aforementioned sacrificial material. Where hermetic sealing or enhanced mechanical strength is desired, a metal overcoat can be employed (see, Gan et. al., "Getter free vacuum packaging for MEMS," Sensors and Actuators A: Physical, 149, (2009), pp. 159-164). Overall, the materials for sacrificial layer, overcoat and hermetic seal should be compatible with existing processes and offer good layer-to-layer adhesion.

Numerous reports of wafer level packaging of MEMS structures using air-cavity technology have been published. Joseph et al. used the decomposition of UNITY® 2303 polymer through a thin $SiO_2$ film to fabricate a cavity that is part of packaged MEMS resonators (see, Joseph et. al., "Wafer-level packaging of micromechanical resonators," IEEE Transactions on Advanced Packaging, 30(1), 2007, pp. 19-26). However, the processing protocol of Joseph et al., is complex because an oxide mask is first used to pattern the UNITY layer. An oxide/polymer (AVATREL®) overcoat was used for mechanical strength and to expose the bond-pads. Similar methods were used to package varactors and accelerometers.

An improvement in the performance of the MEMS devices was observed after packaging with the air-cavity approach of Monajemi et al. (see, Monajemi, et. al., "Characterization of a polymer based MEMS packaging technique," 11th International Symposium on Advanced Packaging Materials: Processes, Properties and Interface, 2006, pp. 139-144). Monajemi et. al. successfully packaged a wide range of MEMS devices using both photodefinable and non-photodefinable UNITY to form the cavity. However, while this processing protocol is simplified by the use of a self-photodefinable material such as UNITY, such materials generally leaves a residue believed to be from a photo-active compound utilized for the patterning (see Monajemi et. al., "A low-cost wafer level MEMS packaging technology", IEEE International Conference on MEMS, 2005, pp. 634-637). Rais-Zadeh et. al. packaged a tunable inductor also using UNITY as the sacrificial polymer and AVATREL as the overcoat material, however as Rais-Zadeh et al., did not use a self-photodefinable UNITY, a separate material was used for the patterning thereof (see, Rais-zadeh et. al., "A packaged micromachined switched tunable inductor", Proceedings of MEMS 2007, Japan, 2007, pp. 799-802). Reed et al. developed a compliant wafer-level process containing air-cavities that offer high on-chip current and enable terabit/s bandwidth, (see, Reed et. al., "Compliant wafer level package (CWLP) with embedded air-gaps for sea of leads (SoL) interconnections," Proceedings of the IEEE 2001 International Interconnect Technology Conference, pp. 151-153).

It has now been found that cavities useful for MEMS structure/device packaging can be fabricated during a final packaging process, e.g., during the curing of a molding material. For example, epoxycyclohexyl polyhedral oligomeric silsesquioxanes (EPOSS) is found to be useful for both patterning a sacrificial material, such as polypropylene carbonate (PPC), and for providing structural rigidity as an overcoat (see, Fritz et. al., "Photodefinable epoxycyclohexyl polyhedral silsesquioxane," Journal of Electronic Materials, 39(2), 2010, pp. 149-156.) EPOSS is a hybrid organic/inorganic dielectric which has interesting mechanical and chemical stability for use as a permanent dielectric in microfabrication of electronic devices. Thus EPOSS can be used to both pattern the sacrificial material, for example PPC, and for the cavity overcoat. As a result, the number of processing steps is reduced which lowers the cost of packaging. It has also been found that a tri-material system, PPC/EPOSS/metal can be used to create cavities which could house a wide range of MEMS devices on a wafer level irrespective of device size and functionality.

The cavity system described herein also has the flexibility to vary the strength of the superstructure surrounding the cavity according chip level packaging requirements. For example, a lead frame package that includes a molding material, such as an epoxy, that is molded at high pressure and cured at an elevated temperature. While various molding techniques are known and used, for example, injection molding, compression molding and transfer molding, it has been found that embodiments in accordance with the present invention can be used to form cavities as a part of such molding techniques. That is to say that the packaging of various cavity containing MEMS devices in accordance with embodiments of the present invention can be carried out by the in situ decomposition of a sacrificial material during or after the aforementioned molding process. This is especially useful for large, semi-hermetic lead frame packages. In accordance with some embodiments, the chip-level package retains essentially all of the sacrificial material during the molding process and the decomposition of the sacrificial material, the cavity formation, is carried out either during the curing step of the molding material, such as an epoxy, or thereafter. In this way, the sacrificial material, being present during the molding step, prevents any collapse of a cavity since such cavity is not formed until during or after the curing of the molding material. Accordingly, embodiments of this in situ method allow for the forming of very large channels and cavities for a range of packaged devices, including where hermetic sealing may not be necessary.

Thus, in accordance with the practice of this invention there is provided a process for manufacturing a wafer-level microelectromechanical systems (MEMS) device package, comprising:

a) providing a substrate having a freestanding movable microelectromechanical structure thereon;

b) forming a thermally decomposable sacrificial layer on said substrate said sacrificial layer being essentially encapsulating said freestanding movable microelectromechanical structure;

c) patterning said sacrificial layer;

d) optionally forming a contiguous, second overcoat layer, said second overcoat layer encapsulating said patterned sacrificial layer and overlying portions of said substrate;

e) optionally coupling said substrate to a chip level package substrate;

f) encapsulating said substrate, and if present said package substrate, with a molding compound at a first temperature for a first period of time where said sacrificial layer remain substantially present; and g) curing said molding compound at a second temperature such that said patterned sacrificial layer is thermally decomposed to form a gas cavity surrounding said freestanding movable microelectromechanical structure.

Substrate

Any of the semiconducting substrates that are typically used in the fabrication of MEMS devices can be utilized in the embodiments of this invention as a substrate or portion thereof. Exemplary materials include, but are not limited to, silicon, silicon compounds, germanium, germanium compounds, gallium, gallium compounds, indium, indium compounds, or other semiconductor materials and/or compounds. In addition, such substrates can include non-semiconductor substrate materials, including dielectric materials such as glasses, diamond, quartz and sapphire, metals such as copper, gold, silver or aluminum, ceramic materials such as alumina or silicon carbide, or any of the organic materials found in printed wiring boards. The contacts are formed from conductors such as metals and/or metal alloys, subject to appropriate considerations such as adhesion and thermal properties.

In accordance with some embodiments of this invention the substrate encompasses a silicon material. Specifically, the substrate is a silicon wafer. In some other embodiments the substrate encompasses a non-silicon material. Suitable non-silicon materials include but not limited to any of the previously listed substrate materials. Specifically, non-silicon materials that include, but not limited to, metal, glass, ceramic or a plastic material, among the others listed above.

Sacrificial Layer

Various sacrificial materials which are known in the art can be used to form the sacrificial layer employed by embodiments in accordance with the present invention. As noted above, one of such sacrificial material is a polycarbonate. Specifically, polypropylene carbonate (PPC). PPC is a copolymer of carbon dioxide and propylene oxide, polymerized at high pressure in the presence of catalyst (see, e.g., Chen et. al., "Copolymerization of carbon dioxide and epoxides with a novel effective Zn—Ni double-metal cyanide complex," Journal of Applied Polymer Science, 107, 2008, pp. 3871-3877). High-purity forms of the PPC exist in regular, alternating units without ether-linkage impurities in the backbone. It is believed that PPC decomposes by chain scission and unzipping mechanisms. Decomposition proceeds via chain unzipping at low temperatures because the cyclic monomer is thermodynamically favored over the straight-chain polymer (see, Du et. al., "Synthesis and degradation behavior of poly(propylenecarbonate) derived from carbon dioxide and propylene oxide", Journal of Applied Polymer Science, 92, 2004, pp. 1840-1846). At higher temperatures, chain scission competes with the unzipping decomposition mechanism. PPC is an attractive sacrificial material for microelectronics because it decomposes cleanly into low-molecular-weight products with little residue in both inert and oxygen-rich atmospheres (see, Spencer et. al., "Stabilization of the thermal decomposition of poly(propylenecarbonate) through copper ion incorporation and use in self-patterning," Journal of Electronic Materials, 40(3), pp. 1350-1363).

Cavities are formed by the decomposition of PPC layers and the permeation of the decomposition products through an overcoat, thus leaving the cavity. Several other polycarbonate systems are known in the literature which can also be used as sacrificial layers. Such other polycarbonate systems undergo thermal decomposition at temperatures that are generally distinct from the decomposition temperature of PPC. Such exemplary polycarbonates include without any limitation, polyethylene carbonate (PEC), polycyclohexane carbonate (PCC), polycyclohexanepropylene carbonate (PCPC), polynorbornene carbonate (PNC), and the like. It should be further noted that any combination of one or more of these polycarbonates can also be employed as well as any combination of copolymers that can be formed therefrom.

In other embodiments of the present invention there is also provided a variety of polymers that can be used to form sacrificial layers. Examples of such polymers without any limitation include polynorbornenes, polyethers, polyesters, functionalized compounds of each, and combinations thereof. The polynorbornenes can include, but are not limited to, alkenyl-substituted norbornene (e.g., cyclo-acrylate norbornene). Any one or more of these polymers can also be used in combination with aforementioned one or more polycarbonates.

Another feature of a sacrificial layer, in accordance with some embodiments of this invention, is the ability to form patterns upon exposure to suitable radiation. Thus, any of the aforementioned polymers can be used alone or in combination with an appropriate additive provided that the resulting formulation can suitably be patterned as well as thermally decomposed as described above.

It is known that additives, such as a photo acid generator (PAG), can be added to polycarbonate composition, such as PPC compositions, not only to lower decomposition temperature but also for patterning. Fritz et al. have shown that different polycarbonates decompose thermally at different temperatures using dynamic thermal gravimetric analysis (TGA). For example, PEC decomposed (50% weight loss) at 165° C., PPC decomposed at 210° C. and both PCC and PCPC copolymer decomposed at 275° C. Accordingly, different polymers can be employed to form a sacrificial layer depending upon the intended use of the MEMS device that is being fabricated as well as the type of substrate material that is being used. See, Fritz et. al., "Polycarbonates as temporary adhesives," International Journal of Adhesion & Adhesives, 38 (2012) 45-49.

In addition, as noted above, various other additives/components can be added to the formulation or composition, which is used for the formation of the sacrificial layer such that thermal decomposition profile and temperature can be tailored as desired. Also, other additives can be used to alter the processability, which include increase or decrease the stability of the sacrificial polymer to thermal and/or light radiation. In this regard, the additives can include, but are not limited to, photoinitiators and photoacid initiators. For example, addition of a suitable PAG to a polycarbonate generally decreases the decomposition temperature of the polycarbonate. That is, the PAG material thermally decomposes into an acid decreasing the decomposition temperature of the polycarbonate, for example, PPC. When exposed to ultraviolet radiation, the acid is generated at a lower temperature catalyzing the PPC decomposition at temperatures as low as 100° C. Accordingly, in some of the embodiments of this invention, the sacrificial layer further encompasses a PAG.

Any of the PAGs known to one skilled in the art which would bring about the above noted results can be employed in this invention. Broadly speaking, the PAG that can be employed in this invention is a nucleophilic halogenides (e.g., diphenyliodonium salt, diphenylfluoronium salt) and complex metal halide anions (e.g., triphenylsulfonium salts). Exemplary PAGs without any limitation include, tetrakis (pentafluorophenyl)borate-4-methylphenyl[4-(1-methyl-ethyl)phenyl iodonium (DPI-TPFPB), tris(4-tert-butyl)phenyl)sulfonium tetrakis-(pentafluorophenyl)borate (TTBPS-TPFPB), tris(4-tert-butyl)phenyl)sulfonium hexafluorophosphate (TTBPS-HFP), triphenylsulfonium triflate (TPS-Tf); triazine (TAZ-101); triphenylsulfonium hexafluoroantimonate (TPS-103); RHODOSIL™ Photoinitiator 2074 (FABA); triphenylsulfonium bis(perfluoromethanesulfonyl)imide (TPS-N1); di-(p-t-butyl) phenyliodonium bis(perfluoromethanesulfonyl)imide (DTBPI-N1); tris(perfluoromethanesulfonyl)methide (TPS-C1); di-(p-t-butylphenyl)iodonium tris(perfluoromethanesulfonyl)methide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2, 3,3,4,4,4-nonafluorobutane-1-sulfonate; bis(4-(tert-butyl) phenyl)iodonium trifluoromethanesulfonate; bis(4-(tert-butyl)phenyl)iodonium 1,1,2,2,3,3,4,4,4-nonafluorobutane-1-sulfonate; and combinations thereof.

If a sacrificial polymer is used alone without any photosensitive additives, such as a PAG, the patterning can be carried out by any of the other known methods, such as for example, reactive ion etching (RIE) after the forming of a patterned layer overlying the sacrificial polymer, or by any other suitable method.

It should further be noted that an appropriate selection of a sacrificial layer can be made based upon the subsequent steps of the process of this invention. For example, if epoxy material is used as a molding compound which typically requires a curing temperature of about 180° C. after injection molding, a suitable sacrificial material that decomposes at around the same temperature would allow cavity-creation and epoxy curing simultaneously. Accordingly, a sacrificial material that decomposes at this temperature range, such as polyethylene carbonate (PEC) can be employed. Advantageously, the sacrificial materials which are employed generally exhibit similar physical properties but feature different decomposition temperature. That is to say, for example, both PEC and PPC exhibit similar physical properties but different decomposition temperatures. The decomposition temperatures can further be modified by additives such as PAGs, as described above.

Embodiments of the disclosed sacrificial composition or formulation include, but are not limited to, a sacrificial polymer and one or more positive tone or negative tone component. As noted above, the positive tone or negative tone component will assist in patterning the sacrificial layer. The positive tone component can include a photoacid generator as described above.

The negative tone component can include compounds that generate a reactant that would cause the crosslinking in the sacrificial polymer. The negative tone component can include compounds, such as, but not limited to, a photosensitive free radical generator. Alternative negative tone components can be used, such as a PAG (e.g., in cross-linkable epoxide-functionalized systems).

A negative tone photosensitive free radical generator is a compound which, when exposed to light breaks into two or more compounds, at least one of which is a free radical. In particular, the negative tone photoinitiator can include, but is not limited to, bis(2,4,6-trimethylbenzoyl)-phenylphosphineoxide (IRGACURE 819, Ciba Specialty Chemicals Inc.); 2-benzyl-2-dimethylamino-1-(4-morpholinophenyl)-butanone-1 (IRGACURE 369, Ciba); 2,2-dimethoxy-1,2-diphenylethan-1-one (IRGACURE 651, Ciba); 2-methyl-1 [4-(methylthio)-phenyl]-2-morpholinopropan-1-one (IRGACURE 907, Ciba); benzoin ethyl ether (BEE, Aldrich); 2-methyl-4'-(methylthio)-2-morpholino-propiophenone; 2,2'-dimethoxy-2-phenyl-acetophenone (IRGACURE 1300, Ciba); 2,6-bis(4-azidobenzylidene)-4-ethylcyclohexanone (BAC-E), and combinations thereof.

The photo-active compound, such as a PAG, can be present from about 0.5% to about 5% by weight of the sacrificial polymer. In particular, the PAG can be present from about 1% to 3% by weight of the sacrificial polymer.

The remaining percentage of the sacrificial composition not accounted by the photoacid generator and sacrificial polymer (e.g., from about 50% to about 99%) can generally be made up with solvent, such as, but not limited to, mesitylene, N-methyl-2-pyrrolidinone, propylene carbonate, anisole, cyclohexanone, propyleneglycol monomethyl ether acetate, N-butyl acetate, diglyme, ethyl 3-ethoxypropionate, and combinations thereof.

A variety of techniques may be used to apply the thermally decomposable sacrificial layer on to the substrate, for example, spin-coating, doctor-blading, sputtering, lamination, screen or stencil-printing, melt dispensing, chemical vapor deposition (CVD), and plasma-based deposition systems or any other similarly known techniques.

Chip Level Packaging

It will be understood that reference herein to MEMS packaging refers to the release of a mechanical structure and the formation of protective structure there-around. It will also be understood that reference herein to chip-level packaging refers to packaging directed to providing structural and environmental protection to a chip or die in conjunction with providing a means for electrical connection of such a chip to another means. Exemplary chip-level packages include, but are not limited to, single and dual inline packages, ball and pin grid arrays, leaded chip carriers and flatpaks where each of such exemplary packages are inclusive of a chip-level package substrate.

Previously, such MEMS packaging was performed as a distinct process prior to any chip-level packaging, thus requiring structures capable of with-standing any stresses that might occur during chip-level packaging. Advantageously, embodiments in accordance with the present invention provide both MEMS packaging and chip-level packing in a single process.

Overcoat Layer

As noted, the MEMS packaging process of embodiments in accordance with this invention can be carried out using only the sacrificial layer. Advantageously, this feature of the embodiment may be more suited for such sacrificial materials which are self-patternable or can be made into patternable compositions by the addition of suitable additives such as PAGs as described above. As also mentioned above, such patterning of the sacrificial layer can also be carried out using any of the known photolithography and etch techniques. In addition, such sacrificial materials generally feature good mechanical, chemical and physical properties such that they would withstand the stringent molding encapsulation conditions as further described below.

Advantageously, embodiments in accordance with the present invention further encompass, prior to patterning the sacrificial layer, providing a first overcoat layer overlying the sacrificial layer. Various organic/inorganic materials and/or compounds can be used as overcoat layers. The properties of the overcoat material used to form the overcoat layer are important in the design of the cavity structure. Generally, the overcoat layer that surrounds the cavity provides mechanical, electrical, chemical, and/or environmental protection for the MEMS device(s). Depending on the particular MEMS device or the particular application, different levels of protection may be desired. Generally, the cavity is an enclosed region that can contain a gas that is not necessarily breathing air and in some embodiments, the cavity is under vacuum conditions. The cavity is generally enclosed by a super-structure.

Generally, the MEMS structure is packaged to ensure protection of the device from the working environment and protection of the environment from device material and operation. For example, one level of protection provides protection from interference with other mechanical structure or objects to ensure structural integrity of the MEMS structure. In this type of enclosure, the overcoat layer can be made of a material that can withstand the general rigors of a particular operating environment of a MEMS device. Another additional level of protection may further provide protection from exposure to oxygen or water (e.g., a hermetic enclosure). Accordingly, for this type of protection, the overcoat layer is generally made of a metal material that provides an airtight seal around the air cavity. In addition, some overcoat layers may also provide an additional level of protection which further provides protection from exposure to any outside gases. For this last level of protection, a vacuum is produced inside the air cavity and the overcoat layer is generally made of a metal material that maintains the vacuum inside the air cavity. It may also be desirable that the overcoat layer is capable of allowing the decomposition gases and/or products formed from the decomposition of sacrificial layer to permeate and/or pass through. Further, in some of the embodiments of this invention, it may also be advantageous to provide a second overcoat layer which can encapsulate the patterned sacrificial layer and the overlying portions of the substrate.

Accordingly, numerous materials can be used as overcoat layers depending upon the type of MEMS that is being fabricated. Exemplary polymers, compounds and/or materials that are suitable as overcoat layers include without any limitation hybrid inorganic/organic dielectric compounds, such as polyhedral oligomeric silsequioxane (POSS). Numerous POSS materials are known in the literature and all of such monomeric and/or polymeric compounds can be used as overcoat layers of this invention. POSS features an interesting film property and has a rigid silicon oxide cage with functionalized organic side groups which can be used for cross-linking. An example of such POSS is epoxycyclohexyl polyhedral oligomeric silsequioxane (EPOSS). Other materials which are suitable as overcoat layers include polyimides, polynorbornene, epoxy resins, benzocyclobutene based polymers, polyamide, and polybenzoxazole (PBO). Many of these materials are commercially available. For example, various polyimides can be purchased: Pyralin PI-2540, PI-2555, PI-2611, PI-2734, PI-2771 and HD4000 (HD Microsystems, Parlin, N.J.; Photoneece DL-1000 (Toray) and PWDC-1000 (Dow Corning, Midland Mich.). Various polynorbornenes are available as Avatrel EPM, Avatrel 2090P, etc. (Promerus LLC, Brecksville, Ohio). Commercial epoxy resins include, among others, SU-8 2025 (Microchem Corp., Newton, Mass.). Benzocyclobutene based polymers are commercially available as Cyclotene 3022-63 (Dow Chemical, Midland Mich.). PBO is available commercially as Sumiresin Excel CRC-8650 (Sumitomo Bakelite, Japan). The overcoat layer can also be deposited on the substrate using techniques described above, such as, for example, spin coating, doctor-blading, sputtering, lamination, screen or stencil-printing, chemical vapor deposition (CVD), plasma based deposition systems, etc.

Advantageously, it has now been found that the use of a spin-coated, photosensitive, hybrid inorganic/organic dielectric, such as EPOSS functions as an effective overcoat material. Further, it has now been found that, a photodefinable dielectric form of EPOSS can be created by the addition of a photo-initiated catalyst to EPOSS. EPOSS can be dissolved in mesitylene to make a 40 wt. % or 60 wt. % solution. An iodonium photo-acid generator is added at 1 wt. % of the EPOSS and sensitizer at 0.33 wt. % of the EPOSS so as to make the formulation photosensitive at 365 nm. Thus in accordance with this aspect of embodiments of this invention the patterning of the sacrificial layer encompasses first patterning the first overcoat layer and transferring the pattern of the first overcoat layer to the sacrificial layer.

Advantageously, it has now been found that by utilizing EPOSS it is now possible to readily pattern a sacrificial material such as polypropylene carbonate (PPC) without the need to include additives with the sacrificial material or to remove a layer that is only useful for patterning such sacrificial layer. Thus the EPOSS can be retained as an overcoat to provide structural rigidity. As noted, EPOSS is a hybrid organic/inorganic dielectric which has interesting mechanical and chemical stability for use as a permanent dielectric in microfabrication of electronic devices. Advantageously, by utilizing EPOSS to pattern the PPC and as the cavity overcoat material, the number of processing steps is reduced and consequently the cost of packaging is lowered. Advantageously, embodiments in accordance with this invention also can provide a tri-material system consisting of sacrificial layer (e.g., PPC)/overcoat layer (e.g., EPOSS)/protective layer (e.g., metal) to create cavities which could house a wide range of MEMS devices on a wafer level irrespective of device size and functionality.

In further embodiments of this invention the first overcoat layer is removed after the patterning of the sacrificial layer, where such removal is accomplished using any of the methods known in the art to remove such patterned overcoat layers. Generally, such removal process involves either a dry or wet etching process. One such process is dry or plasma etching, (e.g. reactive ion etching (RIE)) using a gases that are appropriate to create a plasma when excited, where such plasma provides etching that exhibits sufficient selectivity between the material of the overcoat layer and the sacrificial layer.

In some embodiments of this invention, the first overcoat layer is formed from epoxycyclohexyl polyhedral oligomeric silsequioxane (EPOSS). The thickness of the sacrificial layer and the overcoat layers can be tailored to desirable MEMs device. Accordingly, various thicknesses of sacrificial and overcoat layers can be formed. For example, in some embodiments, the thickness of the sacrificial layer is from about 1 μm to about 10 μm. In some other embodiments the thickness of sacrificial layer is from about 2 μm to about 7 μm.

In some embodiments of this invention, the first overcoat layer is having a thickness of from about 0.1 μm to about 3 μm. In other embodiments the thickness of the first overcoat layer is from about 0.5 μm to about 2 μm.

In yet other embodiments of this invention having a second overcoat layer, such overcoat layer has a thickness of from about 0.1 μm to about 3 μm; while in other embodiments the thickness of such second layer is from about 0.5 μm to about 2 μm.

Molding Compound

As noted above, the MEMS devices made in accordance with the embodiments of the present invention can be finally encapsulated using a suitable molding compound. Any material which can either be injection molded and/or compression molded can be employed for such encapsulation. Such suitable materials include any of the known thermoplastic and/or thermoset materials. Examples of such materials include, without limitation, polyester, polyamide, polyether, polyetherketone, polyimide, polyphenylenesulfide, epoxy and combinations thereof. Such molding compounds may advantageously contain certain inorganic filler materials such as glass, talc, carbon black and the like so as to enhance the mechanical properties of the MEMS device being encapsulated. In some embodiments of this invention the molding compound utilized is an epoxy compound.

In some such encapsulated embodiments of this invention, the thickness of the molding compound is from about 0.1 mm to about 5 mm; while in other such encapsulated embodiments, the thickness of the molding compound is from about 0.2 mm to about 2 mm.

Molding

The cavity system described herein also has the flexibility to vary the strength of a superstructure surrounding the cavity according to the packaging requirements. For example, as previously noted, lead frame packaging generally includes molding an encapsulant at a high pressure. Generally, such high pressure molding is accomplished using one of compression, injection or transfer molding. The injection molding process forces the molding compound (e.g., epoxy molding compound, EMC) around the device in the mold. This is the more traditional process for chip packaging and uses high molding pressures (e.g. 10 MPa). The compression molding process molds only the top side of the device and uses lower pressure than injection molding (e.g. 4 to 10 MPa). Compression molding is commonly used in chip-stacking packages. Advantageously, either of the aforementioned packaging methods provides for the in-situ decomposition of the sacrificial material during the molding process. This is especially useful for large, semi-hermetic lead frame packages. The new, chip-level package retains the sacrificial material during the molding process and performs the decomposition step (cavity formation) during the cure step once the over molding material is rigid, preventing cavity collapse. The in-situ method allows molding and release of very large channels and cavities for a wide range of packaged devices where hermetic sealing is not necessary. For embodiments requiring hermetic cavities, after molding any of the previously described packages can be overcoated with an additional material, generally a metal, to achieve hermeticity.

Generally, the molding is carried out by an injection molding at a temperature of from about 160° C. to about 200° C. and at an injection gauge pressure of from about 8 MPa to about 12 MPa.

In another embodiment of the process of this invention the sacrificial layer is decomposed at a temperature of from about 180° C. to about 250° C. Generally, the decomposition of the sacrificial polymer is carried out at a slow rate and at a steady temperature range in order to ensure that debris-free cavities are formed and at the same time the decomposition gases are removed from the overcoat layer either through permeation or through other mechanisms. Accordingly, if higher decomposition temperature is used, the sacrificial layer decomposes at a faster rate, this aspect is discussed in more detail in the following examples.

In yet another embodiment in accordance with the present invention there is further provided a wafer level microelectromechanical system (MEMS) device package and a process for making such devices. Various known MEMS devices, microfluidic devices, and micro-reactors can be made by the processes of this invention. Exemplary devices include without any limitation, capacitive resonators, varactors, accelerometers, gyroscopes, piezo related devices, and the like. In some such embodiments, the MEMS device packaged and/or made is a capacitive resonator. In other embodiments of this invention the MEMS device packaged and/or made is an accelerometer. In yet other embodiments the MEMS device packaged and/or made is a gyroscope. In still other embodiments of this invention the MEMS device packaged and/or made is a capacitive resonator, or a piezoelectric related device.

In yet another embodiment of this invention there is further provided a wafer level microelectromechanical system (MEMS) device package, comprising:

a) a substrate having a freestanding movable microelectromechanical structure;

b) a cavity surrounding said freestanding movable microelectromechanical structure; the cavity as noted can be a "gas cavity" "air cavity" or simply a vacuum;

c) one or more contiguous overcoat layers disposed around said cavity; and f) a molding compound encapsulating at least part of said substrate, where said cavity is formed by an in situ thermal decomposition of a patterned sacrificial layer.

In a further embodiment of this invention the wafer level microelectromechanical system (MEMS) device package of this invention comprises a capacitive resonator.

In another embodiment of this invention there is also provided a wafer level microelectromechanical system (MEMS) device package, comprising:

a) a substrate having a freestanding movable microelectromechanical structure, said substrate encapsulated with a molding compound; and b) a cavity surrounding said freestanding movable microelectromechanical structure and contacting said molding compound.

This invention is further illustrated by the following examples which are provided for illustration purposes and in no way limit the scope of the present invention.

EXAMPLES

Deep trenches in 100 mm diameter silicon wafers were etched using the Bosch process. These trenches resemble, and are representative of actual capacitive and piezoelectric MEMS devices. Trench widths varied between 2 and 6 µm and the trench depths were approximately 6 µm. Each device was placed in 2 to 6 trenches depending on the type of device and each wafer had several hundred devices. Wafer-level packaging was then carried out using PPC or PEC as the sacrificial layer and EPOSS as the overcoat material system. After completing the packaging steps, the wafers were diced with a diamond saw and characterized using scanning electron microscopy (SEM), nano-indentation, and tape test for metal adhesion.

Turning to FIG. 1, a process flow of one of the embodiments of this invention is shown. PPC was initially spin-coated on the silicon trenches (FIG. 1(a)) and soft baked on a hot-plate at 100° C. for 5 min. Several spin-coating steps were required for deeper and wider trenches. The PPC thickness varied between 3 and 4 µm after baking. For patterning the PPC, EPOSS was spin-coated at 4000 rpm resulting in a 0.6 µm thick film (FIG. 1(b)). EPOSS was pre-baked at 85° C. for 5 minutes, patterned at 365 nm and post-baked at 85° C. for 5 min. EPOSS was spray developed using isopropyl alcohol (FIG. 1(c)). PPC was reactive ion etched using a 6% $CHF_3$ and 94% $O_2$ plasma that resulted in a PPC/EPOSS etch rate selectivity of 24 (FIG. 1(d)). The PPC etch rate was 0.66 µm/min (FIG. 1(e)). The overcoat EPOSS was then spin coated to a thickness of 3 to 6 µm and patterned (FIG. 1(f)). It was baked according to the first EPOSS layer. Finally, the PPC was decomposed at 240° C. for 4 to 10 hours in a nitrogen ($N_2$) environment using a step-wise ramp-rate using the procedures as described in Wu, X. et. al., "Fabrication of microchannels using polynorbornene photosensitive sacrificial materials", Journal of The Electrochemical Society, 150 (9), 2003, pp. H205-H213. The wafers were subjected to a short duration oxygen plasma prior to metallization to improve metal-to-EPOSS adhesion. Aluminum was evaporated to a thickness of 0.7-2 µm and patterned to expose the electrode areas (FIG. 1(g)). For more rigid overcoats, copper (1 to 3 µm) was used instead of aluminum. Titanium (50 nm thick) served as the adhesion layer for the copper metal overcoat. Different cavity-types with dimensions and overcoat thickness are tabulated in Table 1.

TABLE 1

| Simulated devices | Width (µm) | Length (µm) | Metal overcoat (µm) |
|---|---|---|---|
| Capacitive (small) resonator | 10-50 | 300-400 | Al: 0.7 µm, Cu: 1.5 µm, 3 µm |
| Capacitive (large) resonator | 50-150 | 300-400 | Al: 0.7 µm, 2 µm, Cu: 1.5 µm, 3 µm |
| Piezoelectric resonator | 150-200 | 300-400 | Cu: 1.5 µm |

After fabrication, the individual packages were inspected for thermo-mechanical cracking at the edges using an Hitachi FE3500 scanning electron microscope (SEM). Close inspection of the trenches was done using a focused ion beam (FIB) (FEI Nova Nanolab) sectioning tool. The wafer was diced and the shape and cleanliness of the cross-section examined. The small and large devices were diced and inspected. Nano-indentation was carried out to assess the mechanical strength of the cavities. A pressure test was developed using a Hysitron nano-indenter. The nano-indenter used a 20 µm diameter conospherical tip. The test location at the center of 30 to 50 µm wide cavities did not encounter resistance from the sidewalls during experimentation. The cavities were indented at room temperature to a force of 8.5 mN. A cross-hatch tape test was used to determine the adhesion strength of thicker metal overcoats (see, http://www.defelsko.com/technotes/adhesion_methods.htm). After the tape has been applied and pulled off, the cut area was then inspected and rated.

Transfer molding consisted of injecting the epoxy molding around the device into the desired shape. Transfer molding was carried out at 175° C. for 105 seconds at 10 MPa and then post mold cured at 175° C. for 8 hrs, unless otherwise noted. Compression molding was completed on several packages as well. Compression molding places the molding compound on the device and applies a relatively low pressure (e.g. 4 MPa) to form the packaged shape. Samples were cross-sectioned to evaluate the extent of damage. Raman spectroscopy was carded out to investigate debris left in the cavity. Focused ion beam images confirmed debris-free cavities prior to molding. Furthermore, to prevent collapse during molding due to the high pressure, large cavities were metallized with a thicker copper coat. Titanium was used as the adhesion layer. Subsequent packages were molded and observed for cavity damage.

Two dimensional mechanical analysis of air-cavity packages was carried out using Ansys (ANSYS 13.0) finite element modeling. A linear, elastic isotropic model assumed perfect adhesion between polymer and metal layers. A rough, frictional contact (with no slip; infinite coefficient of friction) between overcoat and wafer under high pressure was assumed as a boundary condition. Modeling of all layers was done with PLANE42 elements: a 2D structure with 4 nodes. Contact between EPOSS and the wafer was modeled using CONTAC171 and TARGE169 elements compatible with PLANE42. Both are line elements. The molding pressure was applied from the top and the cavity deflection was measured and compared to experimental conditions. A comparison was also made with a standard analytical solution. The effect of different metals and thicknesses on the deformation and stress distribution within the cavity was studied. Conclusions drawn from simulations helped in the design of stronger overcoats for larger cavities.

The packaging protocol thus developed has been successfully verified on an actual capacitive resonator approximately 100×400 µm in size. The electrical performance of the device was evaluated after packaging.

The first samples studied were smaller devices packaged using 40% EPOSS as the masking material for patterning the PPC sacrificial material and the cavity overcoat material. The cavity width was varied between 20 and 50 µm and the length varied between 200 and 600 µm. To prevent cavity cracking or rupture, the PPC decomposition process was modified from a constant thermal ramp rate to a constant weight percent decomposition rate. The constant rate of decomposition allows for the more orderly diffusion of decomposition products through the overcoat avoiding high internal pressures. Thermogravimetric analysis (TGA) of the polymer was used to determine the parameters for the constant rate of decomposition. The reaction kinetics can be expressed as the nth order Arrhenius relationship, as shown in Equation 1.

$$r = Ae^{\frac{-Ea}{RT}}(1-rt)^n \qquad (1)$$

Where r is the decomposition rate, A is pre-exponential factor, $E_a$ is the activation energy (kJ/mol), T is the temperature (K), and t is time (seconds). The decomposition reaction was determined to be first order (n=1) with a pre-exponential factor (A) and activation energy (Ea) of $9 \times 10^{12}$ min$^{-1}$ and 120 kJ/mol, respectively. Eq. 1 can be rearranged for temperature (T) vs. decomposition time (t) as shown in Equation 2. A rate of 0.25 wt. %/min for the decomposition was used to decompose the PPC. No degradation of the cavities was observed.

$$T = \frac{Ea}{R}\left[\ln\frac{A(1-rt)^n}{r}\right]^{-1} \qquad (2)$$

Figure 2A:
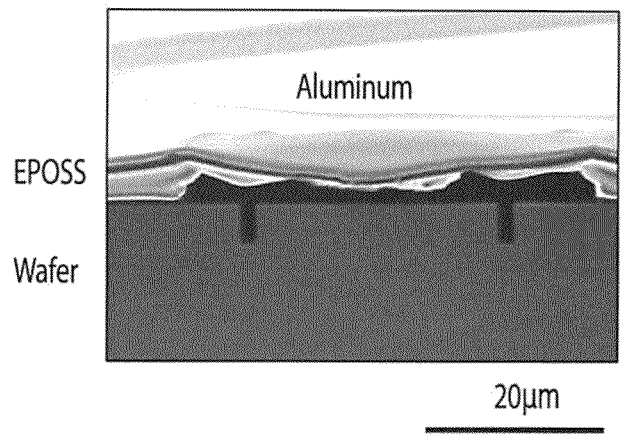
FIGS. 2A and 2B, respectively, show different magnifications of SEM micrographs of cavities formed on smaller simulated devices, in accordance with embodiments of the present invention, which exhibit debris-free decomposition of the sacrificial layer.
Figure 2B:
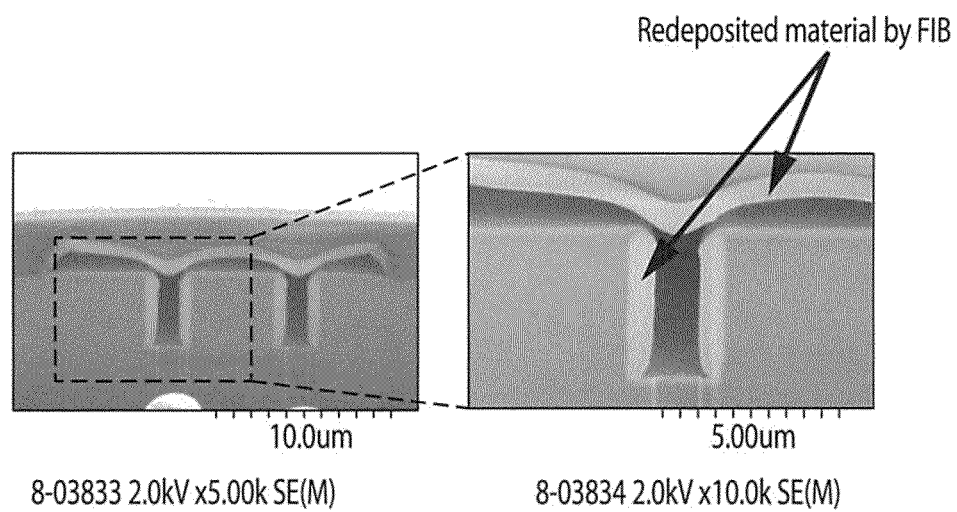

The SEM cross-sections are shown in FIGS. 2(A) and 2(B) and exhibit debris-free cavities with robust, sturdy overcoats. The overcoat stability allowed the cavity to retain the shape of the original PPC structure under the overcoat. Close inspection of the trenches using FIB, FIG. 2(B), also showed clean cavities. Apart from the inadvertent deposition of material from the FIB, the trenches were debris-free. PPC can form non-uniform shapes during spin-coating which leads to occasional dips within the overcoat just above the trench. Such dips do not affect the functionality of our MEMS devices as long as the overcoat does not come in contact with the device area. However; since the cavity to height is reduced above the trench, these areas remain vulnerable during contact or injection molding. Also, these dips become larger if the trench width is increased. Adjusting the PPC thickness by changing the polymer viscosity and spin-coat conditions can mitigate non-planar problems. Spin-coating multiple layers followed by drying (i.e. soft baking) at room temperature can improve the amount of reflow into the trench. The room temperature soft bake prevents thermal reflow of the PPC into the trench and the multiple layers improve planarization of the device features.

Figure 3A:
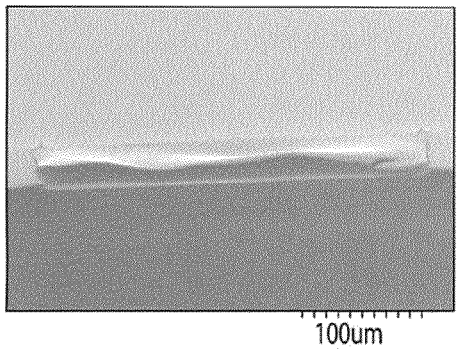
FIGS. 3A, 3B and 3C show, respectively, a cracked thin overcoat layer after decomposition of a sacrificial material to form a cavity, a cavity having a thick, uncracked overcoat layer formed from a single spin coating of a 60% overcoat material solution, and a cavity having a thick, uncracked overcoat layer formed from multiple spin coatings of a 40% overcoat material solution.
Figure 3B:
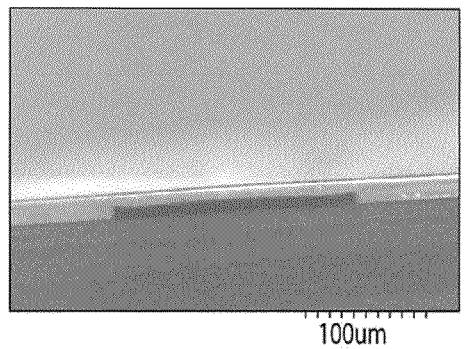
Figure 3C:
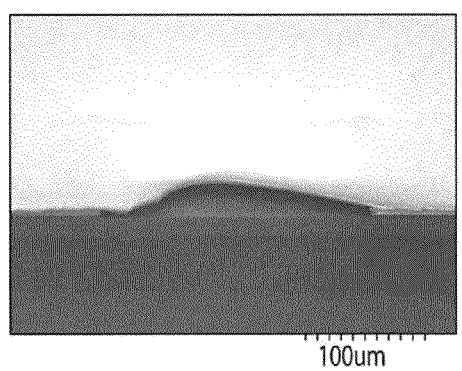

The overcoat formulation was adjusted for different cavity dimensions to provide better uniformity. For large cavities (>100 µm wide), thin overcoat layers tend to crack during PPC decomposition and the overcoat is unable to provide the mechanical strength necessary to support the cavity, as shown in FIG. 3(A). Changing the EPOSS-to-solvent ratio helps tune the properties of the overcoat. The polymer concentration could be raised from 40% to 60% for better control of overcoat uniformity and thickness. The 60% EPOSS formulation results in a lower degree of film cracking (compared to 40% formulation) during thermal decomposition. The thicker film improves coverage and planarization on the edges of the cavity, as shown in FIG. 3(B). Alternatively, several spin coatings of the 40% EPOSS formulation produced a crack-free cavity with similar edge coverage to the 60% EPOSS while maintaining an overall thinner film as shown in FIG. 3(C). In FIG. 3(C), the cavity was cleaved mid-way and hence shows a wavy surface topography. The decomposition ramp rate was lowered when thicker overcoats were used so as to lower the pressure build-up.

Figure 4A:
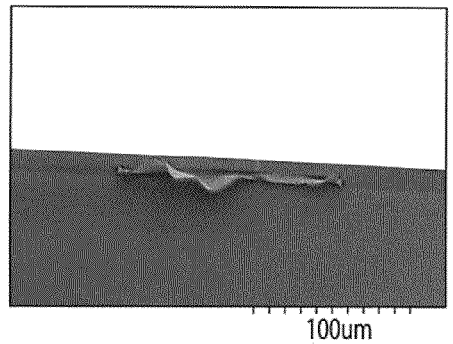
FIGS. 4A, 4B, 4C and 4D show, respectively, cross-sectional view of the air-cavities having residual sacrificial material after incomplete decomposition of the material through a thick overcoat at a first time and temperature, top view having a cracked overcoat layer after decomposition of the sacrificial material at a second temperature higher than the first temperature, top view having a residue free, mechanically robust appearance after decomposition of the sacrificial material at an optimized time and temperature, and a cross-sectional view of the latter (FIG. 4C).
Figure 4B:
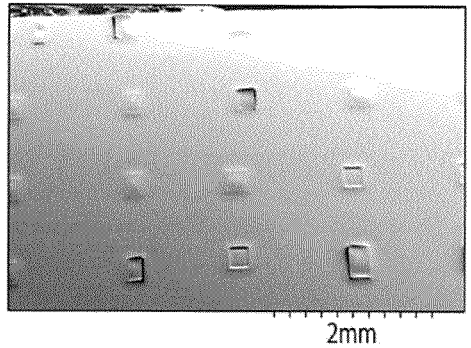
Figure 4C:
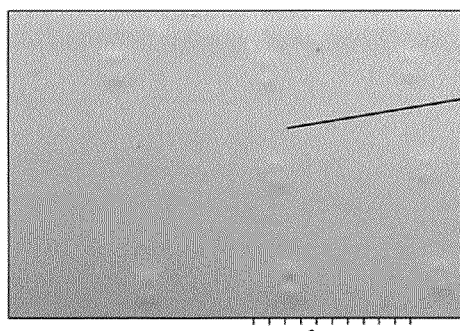
Figure 4D:
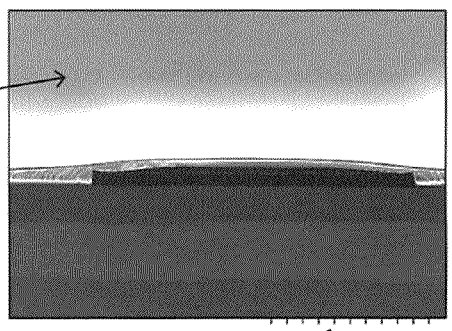

Now turning to FIG. 4(A), this illustrates that a 4 hour decomposition procedure is not long enough to fully decompose the PPC. Higher decomposition temperatures lead to cracking of the overcoat due to pressure build-up during decomposition, as shown in FIG. 4(B). A slow ramp-rate followed by a long temperature hold is necessary to form near-perfect air-cavities with sharp side-walls. In these experiments, 0.5° C./min ramp-rate and 6 to 8 hour hold at 240° C. was necessary for cavities with widths from 50 to 150 μm, see FIG. 4(C). The protocol for packaging capacitive resonators (~50 to 150×400 μm) had to be modified slightly to carry out wafer-level packaging of devices larger than 150 to 300×400 μm.

Figure 5A:
FIGS. 5A and 5B, respectively, show large cavities used to package piezoelectric devices formed in accordance with an embodiment of the present invention, where such cavities show wide trenches and uneven topography while providing cavities having a residue free, mechanically robust appearance.
Figure 5B:
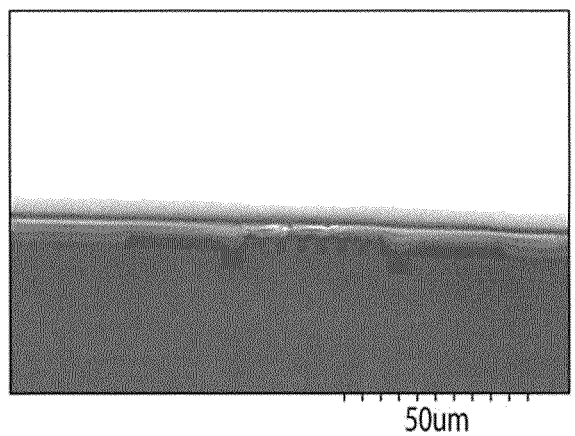

Besides being quite large (~200 μm wide and 500-600 μm long), these devices had complex topography. By using a thicker overcoat (60% polymer) and multiple spin-coats it is now possible to successfully package such complex geometries after a 10 hour decomposition regime for the sacrificial polymer. The resulting cavities (FIG. 5) were found to be clean and mechanically stable. Hence, for smaller devices (less than 150 μm wide), multiple spin coats of 40% polymer with 6 to 8 hour decomposition times were adequate. However, devices with widths larger than 150 μm require multiple spin-coatings of 60% polymer mixtures with longer decomposition times. The decomposition time depends on the thickness of PPC. Wider cavities require thicker PPC films to prevent cavity collapse during decomposition or molding.

Figure 6:
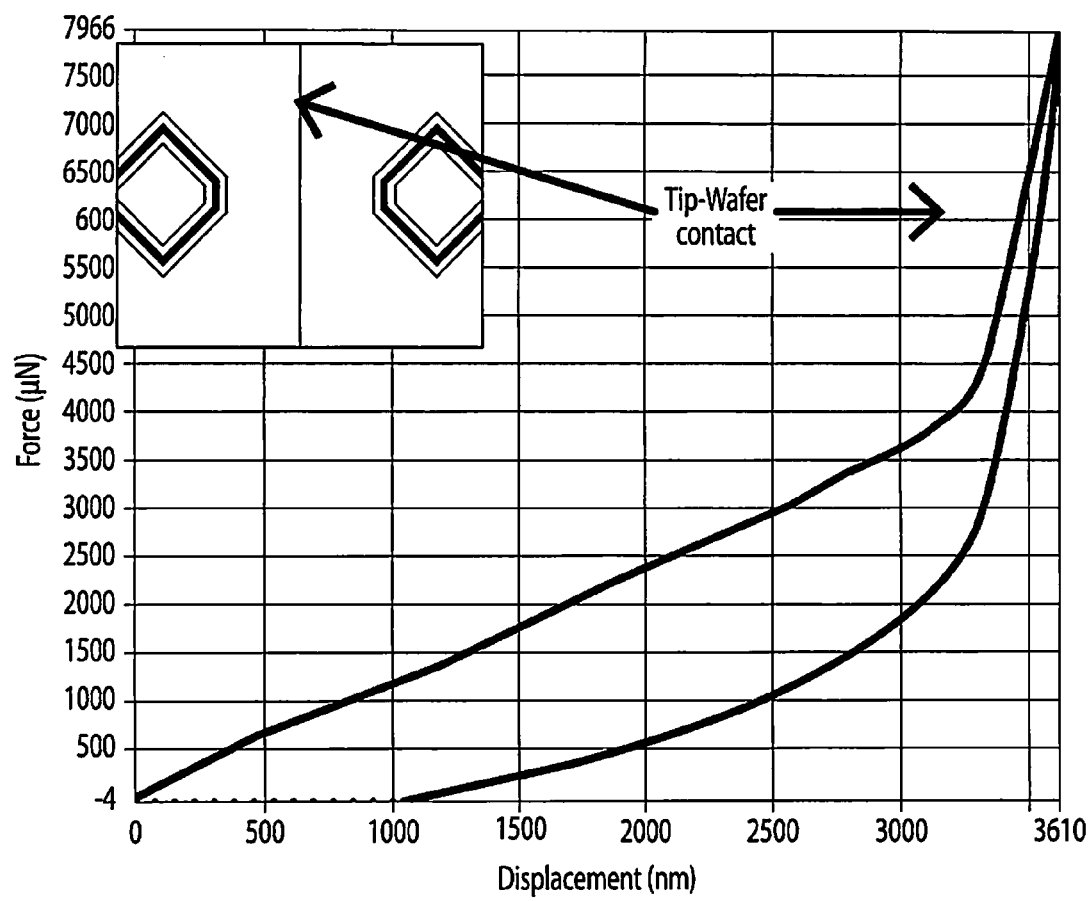
FIG. 6 shows that nanoindentation of a 20 μm wide cavity with a 1 μm aluminum overcoat at a force of 4 mN causes the complete collapse of such cavity (the inlay shows the nanoindentation spot on the cavity).

The robustness of the cavity overcoats was evaluated using nanoindentation. For a 3 μm EPOSS overcoat (40% EPOSS formulation) and 0.7 μm thick aluminum metallization, complete collapse for a 3.5 μm tall cavity was observed at 4 mN as shown in FIG. 6. This translates to a cavity-strength of 51 MPa. Cavities with widths from 10 to 40 μm were tested. The tip was placed in the middle of the cavity to minimize sidewall effects. The nano-indentation results have been tabulated in Table 2. If the aluminum is replaced by 1.5 μm thick copper; the rigidity increases due to the higher elastic modulus of copper compared to aluminum. As summarized in Table 2, the cavity deflects 1.3 μm at 8.46 mN. The deflection is similar to a 2 μm aluminum overcoat. This shows that for an air cavity design with a large deflection, air cavity collapse can be prevented by increasing the modulus of the overcoat material and/or increasing overcoat thickness.

TABLE 2

| Metal | E (GPa) | t (μm) | $F_{max}$ (mN) | $d_{max}$ (μm) |
|---|---|---|---|---|
| Al | 70 | 0.7 | 4 | 3.5 |
| Al | 70 | 2 | 8.5 | 1.1 |
| Cu | 128 | 1.5 | 8.5 | 1.3 |

Figures 7A, 7B, 7C:
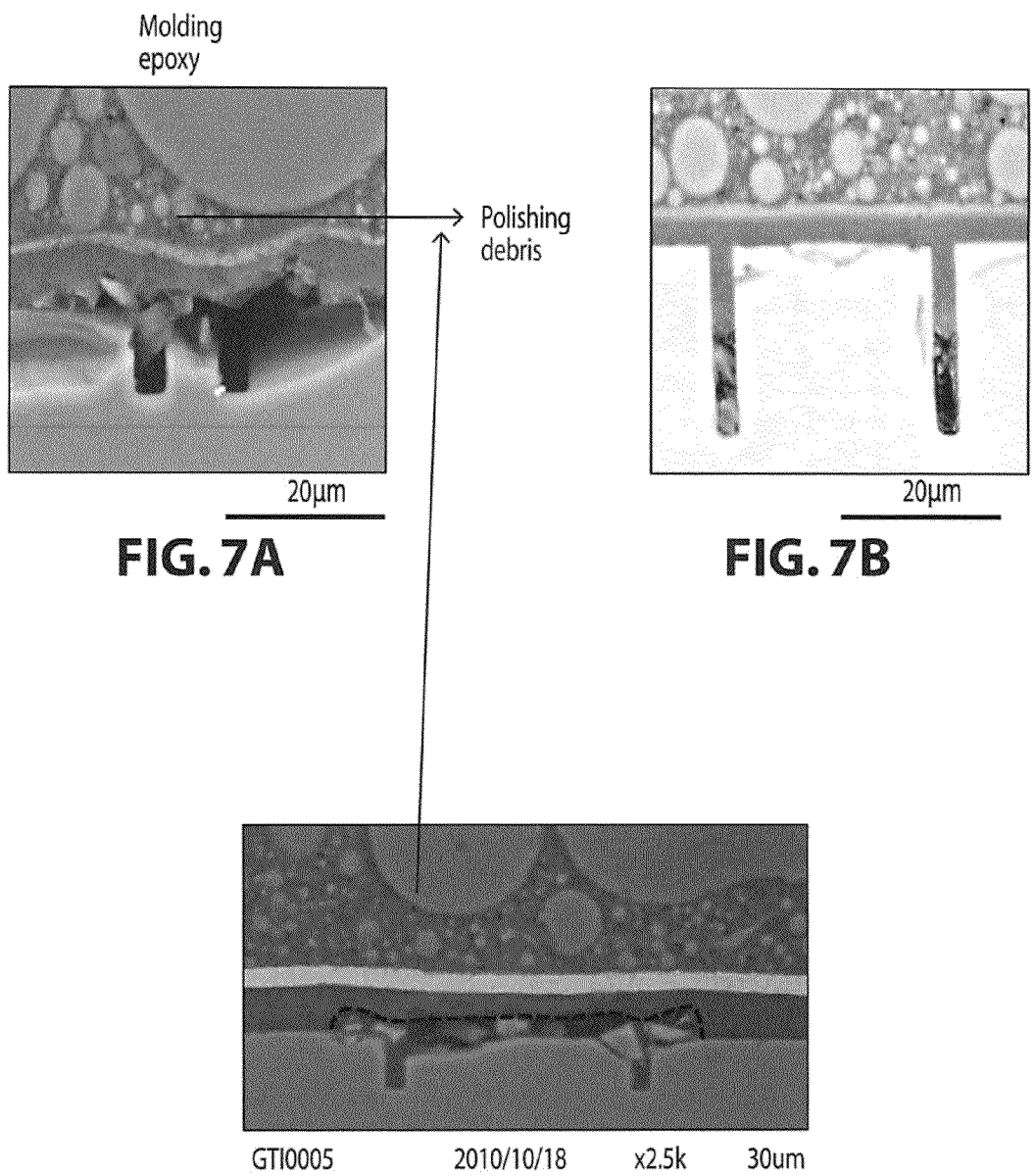
FIGS. 7A, 7B and 7C show, respectively, that a 20 μm wide with 1 μm Al overcoat cavity stays intact under compression molding at a pressure of 4 MPa, that a 50 μm wide cavity collapses completely under compression molding at a pressure of 10 MPa, and that a 50 μm wide cavity exhibits only a 0.5 μm deflection under compression molding at a pressure of 10 MPa where the 1 μm Al overcoat is replace4d with a 3 μm copper.

Once the wafer level package cavities are created they can then be diced and molded for lead frame packaging. Cavities were molded using an epoxy molding compound (EME-G700E, Sumitomo Bakelite, Japan). It was observed that the initial cavities with 0.7 μm aluminum overcoat and 20 μm width, were able to withstand a molding pressure of 4 MPa, FIG. 7(A). However, they collapsed completely at 10 MPa pressure, FIG. 7(B). The debris inside the cavity in FIG. 7(B) was studied using Raman spectroscopy and the spectra shown to be polishing material. Larger cavities (75 μm wide) were observed to completely collapse at both pressures. If we replace the aluminum overcoat with a 3 μm thick copper overcoat, the cavities were able to withstand higher pressure. It was observed that cavities as wide as 100 μm were able to withstand 10 MPa pressure and deform only slightly, FIG. 7(C). In order to increase the cavity strength, for a specific cavity-width, one needs to increase the metal thickness or elastic modulus. Increasing the cavity height would also be an advantage because a larger deformation would be necessary for device failure. However, this would require thicker PPC coatings and subsequently thicker EPOSS overcoats for conformal coverage. The cavity deflections at a certain molding pressure closely match the FEM and analytical models as explained below. Increasing the EPOSS overcoat thickness will affect the cavity strength; however the elastic modulus of EPOSS is approximately 4 GPa which is much lower than either aluminum or copper. Thicker metal layers can also be problematic due to residual stresses.

The 2D FEM model was used to understand the pressure limits in cavity deflection during molding. The normalized Von Mises stress was calculated for specific configurations. As seen from FIG. 8, the FEM model shows the deflection of a 40 μm wide cavity with 0.7 μm thick aluminum at 4 and 10 MPa pressure. At 4 MPa pressure, the measured deflection is 1.5 to 2 μm which is essentially the same as the simulated value of 1.5 μm. At 10 MPa pressure, the experimental cavity completely collapsed to the surface showing no presence of a cavity. However, the 10 MPa simulation shows collapse in the center of the cavity. The simulation included only elastic properties. The full collapse may involve the plastic deformation of the overcoat.

The FEM results were compared to a previously derived analytical model, the rectangular bulge equation, to correlate the deflection values obtained from the finite element technique, as shown in Equation 3. See, Vlassak et al., "A new bulge test technique for the determination of young modulus and Poisson ratio of thin-films," Journal of Materials Research, 7(12), pp. 3242-3249.

$$P = \frac{2ht\sigma_0}{a^2} + \frac{4h^3 Et}{3a^4(1-v^2)} \quad (3)$$

Where, P is the molding pressure. The overcoat material properties are accounted for with E being the elastic modulus, u is the poisson ratio, and $\sigma_0$ is the initial film stress. The variables a, t and h refer to the geometry of cavity. The value a is the half of the width of the cavity, t is the thickness of the overcoat, and h the height of the maximum deflection of the overcoat from its initial location.

The elastic modulus of the overcoat was assumed to be dominated by the metal portion of the metal-polymer composite because the modulus of the metal is about 30 times greater than that of the polymer. The initial film stress, $\sigma_0$, of the annealed, electrodeposited copper film was found to be approximately 30 to 100 MPa depending on thickness from the literature. See, for example, Huang et. al., "Stress, sheet resistance, and microstructure evolution of electroplated Cu films during self-annealing," IEEE Transactions on Device and Materials Reliability, 10(1), 2010, pp. 47-54. When the initial calculations were made the first term of the equation was significantly smaller than the second term using literature values. The first term was assumed to be negligible for further calculations in estimating the deflection of the cavity. The two controllable factors for design is the metal thickness and adjustment of the cavity height to prevent total deflection.

Figure 8A:
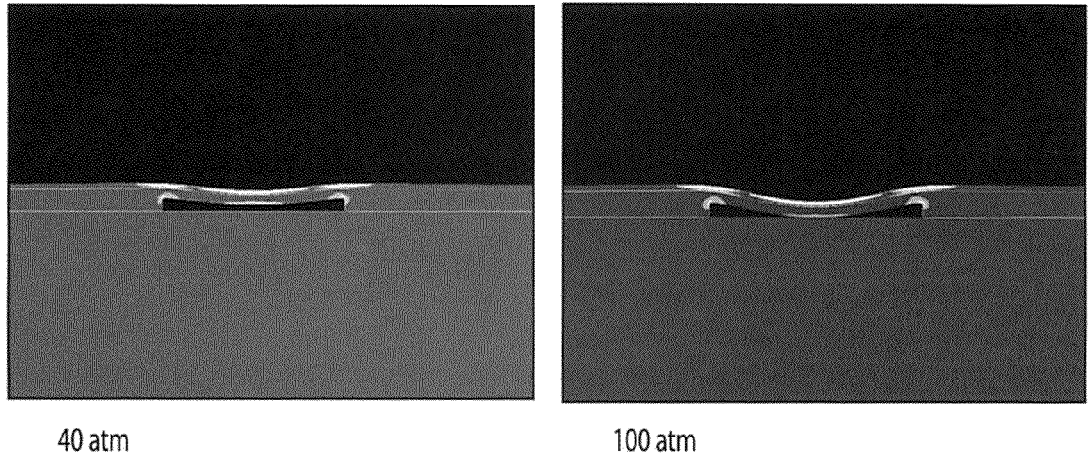
FIGS. 8A and 8B show, respectively, normalized stress profiles of compressed cavities and that efficient cavity design can, through controlled sacrificial material decomposition, lead to lower stress/damage during molding.
Figure 8A:
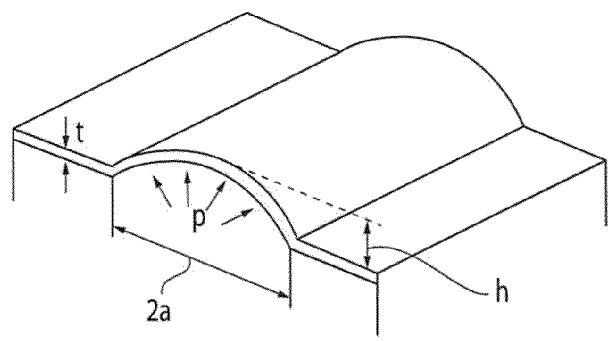
Figure 8B:
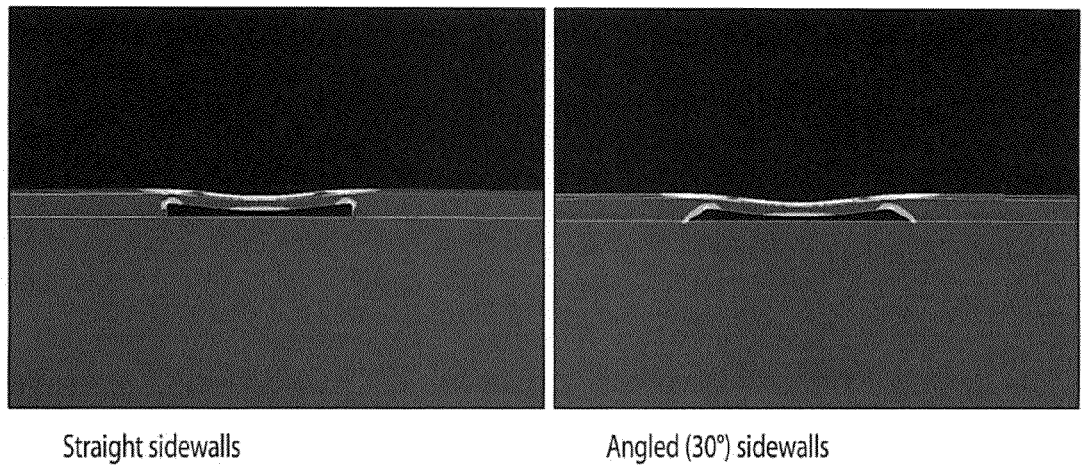

As shown in FIG. 8, the corresponding deflection values were 2 μm and 2.8 μm for 40 and 10 MPa pressure, respectively. These values match both experimental and FEM values. The overall stress in the overcoat and deflection of the air-cavity could be further reduced through optimization of the thicknesses and annealing conditions. For example, a 10% decrease in the maximum stress along the cavity sidewalls was observed by forming a 30° slope in the side-walls. Changing the cavity from a straight side-walled structure to a sloped sidewall through the patterning and reflow of the PPC will help optimize a cavity that is more resistant to stress as has been published earlier. The total deflection of a 3 μm copper overcoat at 10 MPa pressure was found to be 0.56 μm from Eq. 3, which is the same as the experimental deflection in FIG. 7(C).

The adhesion between EPOSS and the substrate, and EPOSS with the metal overcoat was found to be excellent. However, in order to increase the cavity strength, a thicker metal overcoat was required. When thicker metal overcoats were used, e.g. 2 μm aluminum, the residual stress during e-beam deposition was believed to be great enough to cause adhesive failure between the aluminum and the EPOSS. An oxygen plasma clean was used prior to metal deposition to improve the adhesion. For thicker copper overcoats, copper was electroplated at low current density on the sputtered seed layer followed by annealing at 180° C. for 1 hour to reduce the internal stress. After annealing, the metal film exhibited excellent adhesion.

The results presented above show that there are numerous methods to strengthen the overcoat and fabricate ever wider cavities. However, there is a limit to the metal thickness (e.g. metal adhesion and residual stress) and optimization of the cavity shape has a limited benefit. In order to fabricate significantly wider cavities, a new approach to creating semi-hermetic chip level packages was developed which prevents collapse of the cavity during molding. In the process described above, the PPC was slowly decomposed prior to injection molding. The overcoat was designed to withstand the molding pressure. During molding the epoxy encapsulant quickly hardens. The new approach leaves the sacrificial polymer in the cavity during the initial molding step. Once the encapsulant has hardened, the sacrificial polymer in the cavity can be decomposed creating a cavity during post mold curing of the encapsulant. Since the encapsulant is rigid during PPC decomposition, there are few size restrictions for the cavity and no metal support is necessary for the molding process.

This in-situ cavity creation process needs to fit within the post mold cure temperature-time cycle. Typical post mold cure conditions are between 175° C. to 190° C. for eight hours. Thus, the sacrificial material needs to be chosen so as to completely decompose within this temperature-time profile. The sacrificial material must also be stable enough not to decompose in the early stage of molding when the epoxy encapsulant is not rigid.

Figure 9:
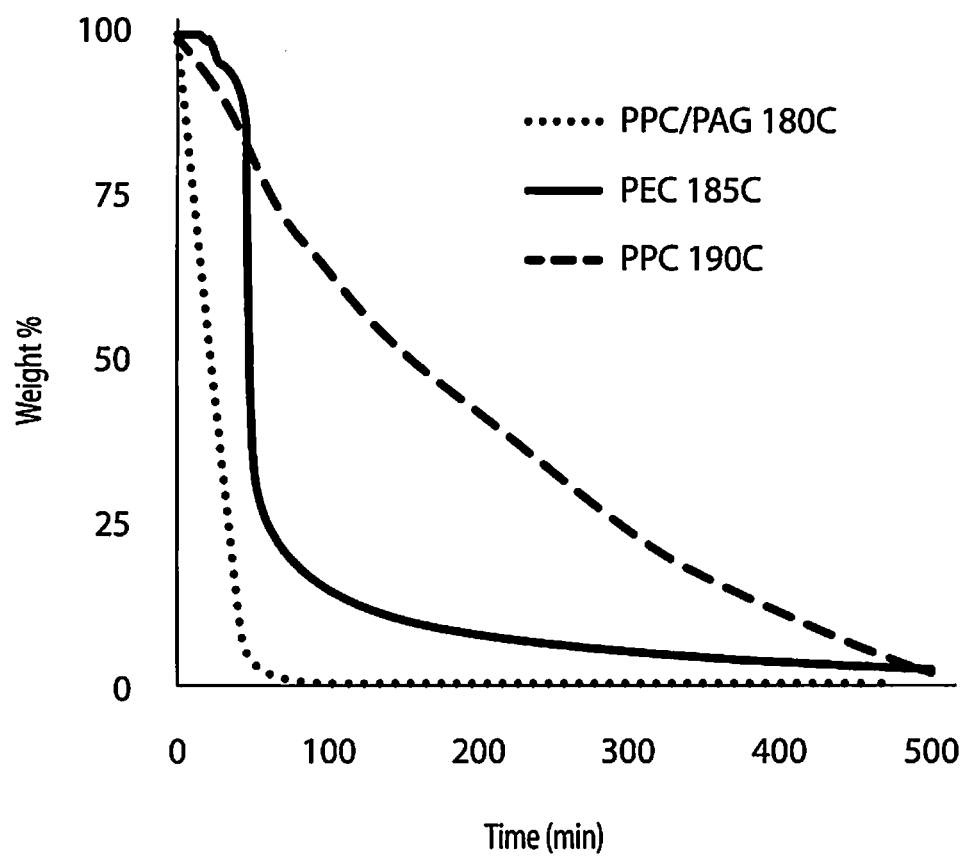
FIG. 9 shows isothermal TGA of polycarbonates to be decomposed in 8 hours.

Isothermal TGA data was collected for a set of polycarbonates to identify materials that remain intact during molding and yet will decompose during post mold curing. FIG. 9 shows the weight change of PPC at 190° C. and PEC at 185° C. Decomposition occurs slowly with complete decomposition within the target eight hour period. Little decomposition occurs within the first minutes of the isothermal scan which corresponds to the time in the mold at high pressure. The percent weight change as shown in FIG. 9 was measured for samples being held at a single temperature. The rate of weight change (i.e. slope of the curve in FIG. 9) could be changed by holding the polymer sample at a different temperature. If a higher temperature were used, each of the polymers would lose weight more rapidly. As already discussed above, Spencer et al. quantified the weight change for PPC as a function of temperature and other additives. Spencer et al. captured the details of the weight change by fitting the TGA data to a form of the Arrhenius Equation as discussed above. The data for several batches of PPC from different suppliers were fit to the Arrhenius equation 1. This study demonstrated that time and temperature are both important and can be adjusted independently. One can achieve the same amount of weight loss at a lower temperature by waiting longer or by raising the temperature for a shorter amount of time. See, Spencer et al., "Decomposition of poly(propylene carbonate) with UV sensitive iodonium salts," Polymer Degradation and Stability 2011, 96, pp 686-702.

Figure 10A:
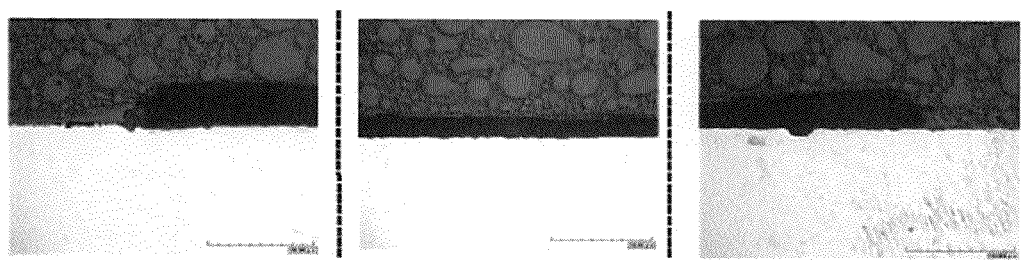
FIGS. 10A and 10B show, respectively, cross-sectioned in-situ decomposition/cure chip level packages: 2 mm diameter, 18 μm tall cavity formed by PPC decomposition at 190° C. (A); 2 mm diameter, 12 μm tall cavity formed by PEC decomposition at 185° C. (B).
Figure 10B:
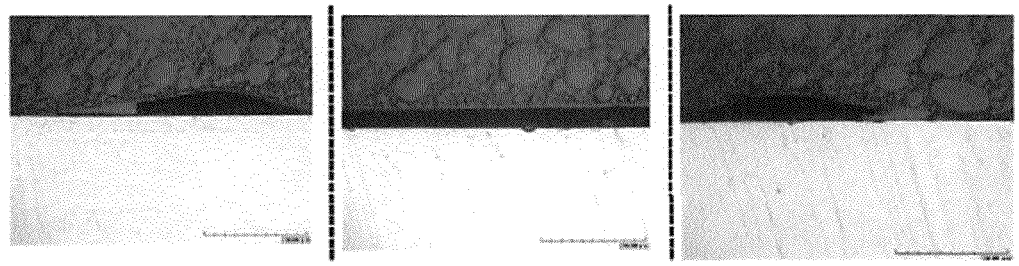

The third sacrificial polymer investigated was PPC with a 3 wt. % PAG loading. This mixture decomposes faster than the pure polymer at the target temperature and may leave a residue from the PAG loading. Each material was patterned using a EPOSS mask followed by RIE, as described above. The cavities were 1 and 2 mm diameter circles and squares and 10 and 18 μm tall. The patterned sacrificial material was coated with a 3 μm EPOSS overcoat to seal the cavities for dicing and handling. After dicing, the cavities were injection molded at 175° C., 10 MPa for 100 seconds. Sets of cavities were decomposed and cured at 185° C. and 190° C. for the full eight hours. The cavities were then cross-sectioned for examination. The PPC with PAG cavities collapsed under the molding conditions, as was expected from the TGA data. This is due to the fast decomposition of the sacrificial material before the epoxy compound became rigid. The cavities formed using PPC at 185° C. had a small amount of residual PPC after 8 hours decomposition, however the same cavities cured at 190° C. producing clean structures, as shown in FIG. 10(A). The PEC cavities were fully decomposed above 185° C. giving clean cavities. The PEC cavity in FIG. 10(B) was slightly deformed due to reflow of the PEC during the patterning and overcoating. Both PPC and PEC cavities exhibited no size or shape limitations. The yield on forming 1 to 2 mm squares and circles was high and it is expected that much larger cavities could be formed because little force is exerted on the structure when the sacrificial material decomposes.

Figure 11A:
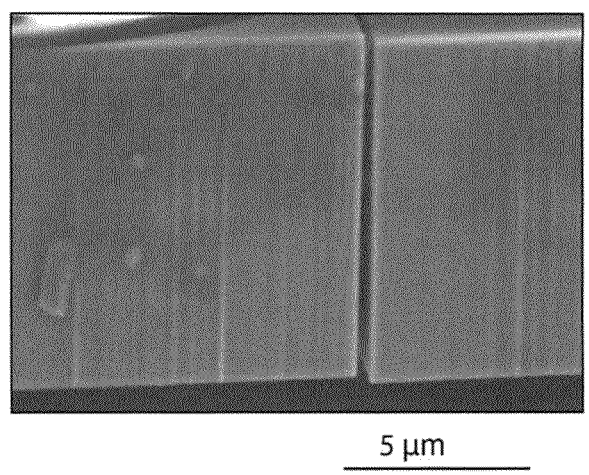
FIGS. 11A and 11B show, respectively, a packaged capacitive resonator device: device shows clean sensing electrode FIG. 11(A); and device performance was measured successfully FIG. 11(B).
Figure 11B:
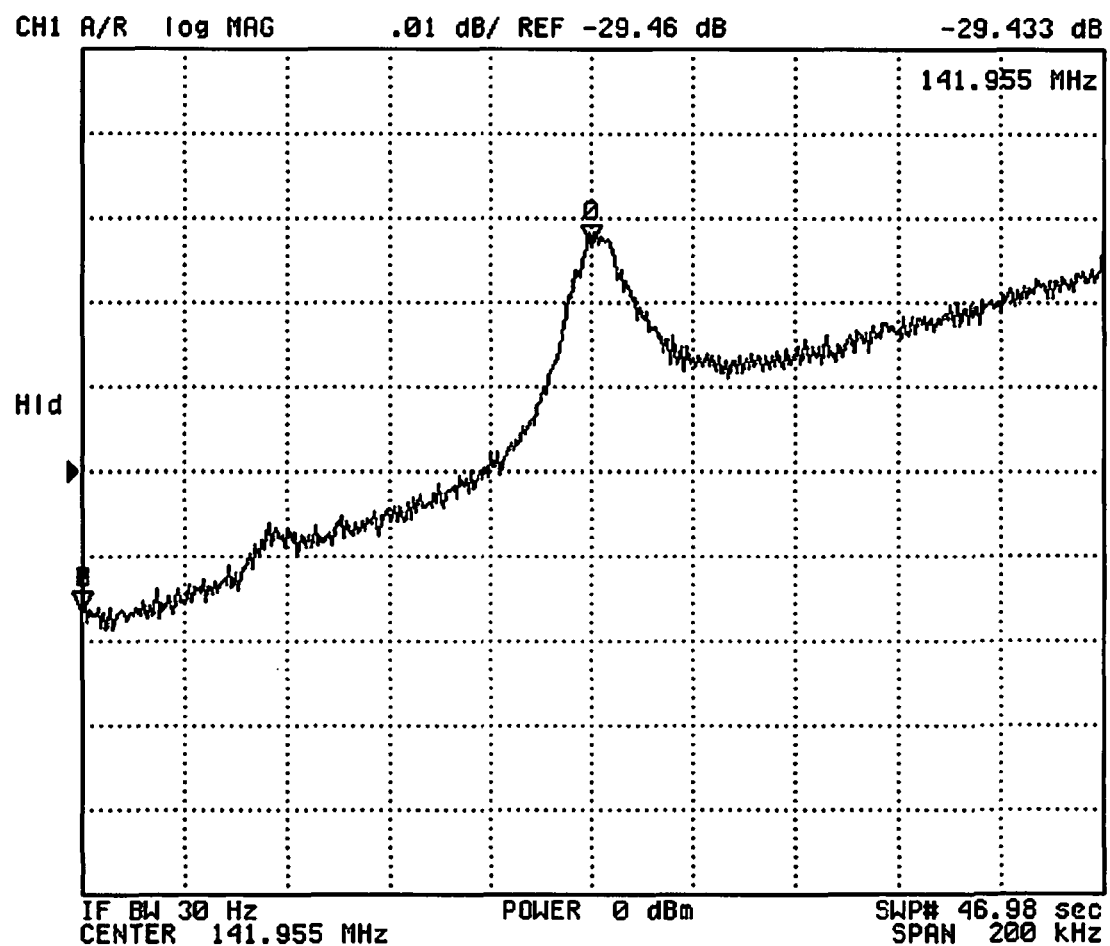

High-performance, high-frequency single-crystal silicon capacitive resonators have been fabricated using the high-aspect ratio poly and single crystalline silicon (HARPSS) fabrication process on silicon-on-insulator substrates. See, Pourkamali et. al., "Low-impedance VHF and UHF capacitive silicon bulk acoustic wave resonators—Part I: Concept and fabrication," IEEE Transactions on Electron Devices, 54(8), 2007, pp. 2017-2023. These devices contained the same cavity size as the structures shown in FIG. 10, except for the fact that the trenches were fabricated in an SOI wafer and the oxide was etched, thus releasing the cantilevers to form a functioning device with metal bond-pads. Wafer-level packaging was carried out on these devices using the EPOSS/PPC/ Al system. After packaging, they were electrically tested for package integrity and subsequently diced for SEM analysis. FIG. 11(A) shows SEM micrographs of the device cross section. A debris-free cavity was observed. The device performance was measured, as shown in FIG. 11(B). Since the device performance could not be measured prior to packaging, it was not possible to analyze the effect of packaging on performance. However, a clean sensing electrode surface was observed after dicing which shows negligible effect of packaging on device performance. The device performance was measured and a loss of 29 dB was observed at a resonant frequency of 141 MHz, which is typical of companion devices. The losses are similar to published values on these devices. See, for example, Pourkamali et. al., "Low-impedance VHF and UHF capacitive silicon bulk acoustic-wave resonators—Part II: Measurement and characterization," IEEE Transactions on Electron Devices, 54(8), 2007, pp. 2024-2030.

The simplicity and use of existing materials gives us encouragement as to the reliability of this packaging approach. The temperature cycling and thermo-mechanical reliability of these cavities have been tested. These cavities remain intact during the molding procedure under temperatures of 175° C./8 hours and 10 MPa pressure.

These examples clearly illustrate the utility of this invention, wherein a tri-material system comprising of PPC/EPOSS/metal has been successfully used to fabricate air-cavities to package MEMS devices on a wafer-level. The air-cavities are flexible in size and shape, mechanically robust, and debris-free. Nano-indentation was carried out to estimate the mechanical strength of the cavities. Compression/injection molding was carried out on cavities with different metal overcoats. Stronger and thicker metal overcoats offer better cavity-strength. 2D FEM analysis was used to correlate the experimental observations. Both FEM and analytical equations were able to predict the deformation behavior of the cavities under applied molding pressure. A novel semi-hermetic package was created using an in-situ sacrificial decomposition/epoxy cure molding step for creating large cavity chip packages. Further, a set of capacitive resonator devices were successfully packaged and characterized using this process.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A process for manufacturing a wafer-level microelectromechanical systems (MEMS) device package, comprising:
   a) providing a substrate having a freestanding movable microelectromechanical structure;
   b) forming a thermally decomposable sacrificial layer overlying said substrate, where said sacrificial layer essentially encapsulates said freestanding movable microelectromechanical structure;
   c) patterning said sacrificial layer;
   d) encapsulating said substrate with a molding compound at a first temperature for a first period of time where said sacrificial layer remains substantially present; and
   e) curing said molding compound at a second temperature such that said patterned sacrificial layer is thermally decomposed to form a cavity surrounding said freestanding movable microelectromechanical structure.

2. The process of claim 1 where said substrate comprises a silicon material.

3. The process of claim 1 where said sacrificial layer is formed from a material selected from the group consisting of polycarbonate, polynorbornene, polyether, polyester and combinations thereof.

4. The process of claim 1 where said sacrificial layer is formed from a polycarbonate selected from the group consisting of polypropylene carbonate (PPC), polyethylene carbonate (PEC), polycyclohexane carbonate (PCC), polycyclohexanepropylene carbonate (PCPC), polynorbornene carbonate (PNC) and combination thereof.

5. The process of claim 1 where said sacrificial layer is formed either from polypropylene carbonate (PPC) or polyethylene carbonate (PEC).

6. The process of claim 1 where said sacrificial layer is having a thickness of from about 1 μm to about 10 μm.

7. The process of claim 1 where said molding compound is having a thickness of from about 0.1 mm to about 5 mm.

8. The process of claim 1 where said molding compound is an epoxy compound.

9. The process of claim 1 where said molding is carried out by an injection molding at a temperature of from about 160° C. to about 200° C. and at an injection gauge pressure of from about 8 MPa to about 12 MPa; and where said sacrificial layer is decomposed at a temperature of from about 180° C. to about 250° C.

10. The process of claim 1 where said sacrificial layer is formed from polyethylene carbonate (PEC).

11. The process of claim 1 where said sacrificial layer further comprises a photo-acid generator (PAG).

12. The process of claim 11 where photo-acid generator (PAG) is selected from the group consisting of tetrakis(pentafluorophenyl)borate-4-methylphenyl[4-(1-methylethyl) phenyl iodonium (DPITPFPB), tris(4-t-butylphenyl)sulfonium tetrakis-(pentafluorophenyl)borate (TTBPS-TPFPB) and tris(4-t-butylphenyl)sulfonium hexafluorophosphate (TTBPS-HFP).

13. The process of claim 11 where said photo-acid generator (PAG) is a diphenyliodonium or triphenylsulfonium salt.

14. The process of claim 1 further comprising, prior to patterning the sacrificial layer, providing a first overcoat layer overlying said sacrificial layer where said first overcoat layer is formed from a polymer selected from the group consisting of epoxycyclohexyl polyhedral oligomeric silsequioxane (EPOSS), polyimide, polynorbornene, epoxy resin, benzocyclobutene based polymer, polyamide and polybenzoxazole (PBO).

15. The process of claim 14 where patterning said sacrificial layer comprises first patterning said first overcoat layer and transferring the pattern of said first overcoat layer to said sacrificial layer.

16. The process of claim 15 where said first overcoat layer is removed after said patterning of said sacrificial layer.

17. The process of claim 14 where said first overcoat layer is formed from epoxycyclohexyl polyhedral oligomeric silsequioxane (EPOSS).

18. The process of claim 17 where said first overcoat layer is having a thickness of from about 0.1 μm to about 3 μm.

19. The process of claim 14 further comprising a contiguous second overcoat layer, said second overcoat layer encapsulating said patterned sacrificial layer and overlying portions of said substrate.

20. The process of claim 19 where said second overcoat layer is having a thickness of from about 0.1 μm to about 3 μm.

* * * * *